United States Patent [19]

Limburg et al.

[11] 3,917,483

[45] Nov. 4, 1975

[54] PHOTOINDUCED ACID CATALYZED DEPOLYMERIZATION OF DEGRADABLE POLYMERS

[75] Inventors: William W. Limburg, Penfield; Dana G. Marsh, Rochester, both of N.Y.

[73] Assignee: Xerox Corporation, Stamford, Conn.

[22] Filed: Nov. 1, 1973

[21] Appl. No.: 411,603

[52] U.S. Cl. ................ 96/27 R; 96/35.1; 96/115 R; 204/159.21; 96/28; 96/35; 96/36.3

[51] Int. Cl.² ........................ G03C 5/04; G03C 1/58

[58] Field of Search ............... 96/115 R, 27 R, 35.1; 204/159.21

[56] References Cited

UNITED STATES PATENTS

| | | | |
|---|---|---|---|
| 2,892,712 | 6/1959 | Plambeck, Jr. | 96/36.3 |
| 3,558,311 | 1/1971 | Delzenne et al. | 96/36.3 |
| 3,779,778 | 12/1973 | Smith et al. | 96/115 R |

*Primary Examiner*—Roland E. Martin, Jr.
*Assistant Examiner*—J. P. Brammer
*Attorney, Agent, or Firm*—James J. Ralabate; James P. O'Sullivan; John H. Faro

[57] ABSTRACT

An imaging process based upon the ultraviolet light induced acid catalyzed degradation of a composition containing at least one acid degradable polymer of the formula:

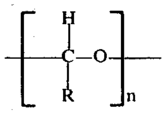

wherein $R$ is an aliphatic hydrocarbon radical of 1 to 6 carbon atoms, a chlorinated aliphatic hydrocarbon radical of 1 to 6 carbon atoms or a nitrile substituted aliphatic hydrocarbon radical of 1 to 5 carbon atoms; and $n$ is at least 50.

In the above imaging process, one or more of the above degradable polymers is formulated with a latent acid. Upon irradiation of a film containing these materials with activating electromagnetic radiation, the latent acid is photoactivated and undergoes protolytic dissociation. The resulting localized increase in acidity initiates degradation of the degradable polymer in the irradiated regions of the film. The effects of this selective degradation are visually discernable, thus, producing a permanent image without further development or fixing being required.

18 Claims, 3 Drawing Figures

PHOTOINDUCED ACID CATALYZED DEPOLYMERIZATION OF DEGRADABLE POLYMERS

BACKGROUND OF THE INVENTION

1. Field of the Invention

This invention relates to a process, a composition and an article. More specifically, this invention relates to photoinduced, acid catalyzed degradation of a degradable polymer. Such degradation may be performed selectively and, thus, this system is useful in the formation of permanent visible images within a film containing one or more of such degradable polymers. The image so generated may take the form of raised and depressed regions within the imaging layer and thus a film so imaged may be used as a relief printing master.

2. Description of the Prior Art

The use of photodegradable polymers in the preparation of relief images is well-known, see, for example, U.S. Pat. Nos. 3,558,311; and 2,892,712 (Examples 7 and 9). In such processes, the selective illumination of an imaging layer containing such polymers results in degradation of the photodegradable polymer into lower molecular weight materials. The products of such degradation differ from the nondegraded polymer and therefore provide a basis for image formation. In the U.S. Pat. No. 3,558,311 , the selective illumination of a polymer containing an oxime ester results in selective degradation of the polymer in the exposed regions of a film containing said polymer. The image is "developed" by removal of the degraded materials from the imaging layer by solvents which are specific for the degradation products but unreactive toward the unexposed regions of the imaging layer. The U.S. Pat. No. 2,892,712 is similar in its disclosure, however, subsequent to imaging of the films of an unstabilized formaldehyde polymer, the image is "developed thermally". In both these disclosures, the intensity and duration of exposure required to produce photolytic degradation within such films, is quite extensive. Moreover, even after such extensive imaging, the image is still not visible, but requires development either with solvents or by thermal treatment. These systems, are, thus inefficient, expensive and impractical for use commercially.

The art also discloses photoinduced protolytic dissociation of certain aromatic acids in aqueous solution, T. Forster, Z. Electrochem. 54, 42 (1950); and A. Weller, Z. Electrochem. 56, 662 (1952). It has also been shown that similar protolytic dissociation can be photoinduced in monosubstituted phenols, W. Bartok et al, Photochem. and Photobio., 4, 499 (1965). The magnitude of shift in the acid dissociation constant of a material as it undergoes a transition from the ground to the excited state will vary from material to material. Naphthols, for example, reportedly experience a shift in acid dissociation constant on the order of about $10^6$ to $10^7$ upon photoexcitation with ultraviolet light.

Accordingly, it is the object of this invention to provide a method for rapid and efficient degradation of select polymers.

It is a further object of this invention to adapt said method for use in an imaging system.

It is another object of this invention to provide a high gain imaging system based upon the rapid and efficient acid catalyzed degradation of select polymers within an imaging layer.

It is a further object of this invention to provide a high gain imaging system wherein selective acid catalyzed degradation of specific polymers is initiated with ultraviolet light.

Still yet another object of this invention is to provide an imaging layer useful in the above imaging method.

SUMMARY OF THE INVENTION

The above and related objects are realized by providing a process for the selective degradation of a composition comprising at least one acid degradable polymer of the formula:

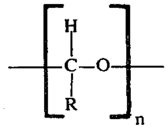

wherein

*R* is an aliphatic hydrocarbon radical of 1 – 6 carbon atoms, a chlorinated aliphatic hydrocarbon radical of 1 – 6 carbon atoms, or a nitrile substituted aliphatic hydrocarbon radical of 1 – 5 carbon atoms; and

*n* is at least 50.

In the preferred process of the invention, a thin film of a composition comprising at least one degradable polymer of the above formula and a latent acid are subjected to selective illumination with ultraviolet light for a brief interval whereupon a visible image is formed within the thin film.

In the preferred embodiments of this invention, the acid degradable polymer is poly(acetaldehyde); and the latent acid is beta-naphthol. It is also preferable that irradiation of such films be preformed with ultraviolet light at a wavelength of less than about 3000 A.

DESCRIPTION OF THE INVENTION INCLUDING PREFERRED EMBODIMENTS

Figure 1:
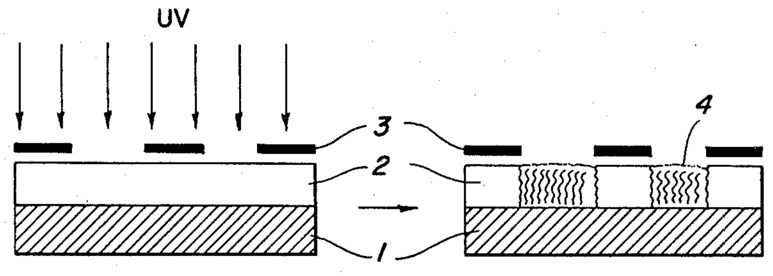
FIG. 1 is an elevational view in vertical crosssection through an imaging member wherein the exposed areas of its imaging layer becomes soft and tacky subsequent to irradiation with ultraviolet light.

According to the process of this invention, a composition comprising an acid degradable polymer and a latent acid are formed into a substantially uniform film. The technique used in fabrication of this composition is incidental to the process and articles of this invention. For example, the various components of the film can be dissolved in tetrahydrofuran and then the resulting solutions sprayed, drawn, spin or dip coated on an appropriate substrate, or formed independant of such substrate into self supporting films by solvent casting techniques. Where such films, either because of their relative thickness or because of their ultimate use, are to be associated with a substrate, it is generally advisable to form the film directly on the substrate.

The composition of this film, as indicated previously, can comprise one or more acid degradable polymers having the hereinbefore described structural formula. These degradable polymers comprise the major active component of such films, irrespective of whether such polymers are copolymerized with or dispersed throughout other thermoplastic materials; occur as block segments in combination with structural units from other polymers; or occur as side chains appended from the backbone of another polymer. Representative of the acid degradable polymers suitable for use in the above composition include poly(acetaldehyde); poly(propionaldehyde); poly(butyraldehyde); and mixtures or copolymers thereof. Where other thermoplastic resins are used in association with the acid degradable polymers, these resins may also undergo acid degradation or be relatively inert to such attack.

The latent acid of the above composition is a material which is generally regarded as nonacidic in the ground state, but which upon irradiation with activating electromagnetic radiation undergoes an electronic transition to an excited state whereupon a proton becomes dissociated from said material and released into the surrounding matrix. The efficiency with which such latent acids undergo this protolytic dissociation will of course depend upon the acid dissociation constant of the material in the excited state. The quantity of latent acid present in the composition containing the acid degradable polymer must be sufficient to effectively catalyze degradation of said polymer. Good results are obtained wherein the composition contains anywhere from about 0.1 to about 5 parts by weight latent acid per 100 parts by weight acid degradable polymer. Latent acids which are especially preferred for use in this composition are capable of undergoing a rapid and efficient electronic transition from the ground to the excited state in response to electromagnetic radiation; the duration of exposure and intensity of such radiation being insufficient by itself to cause any change in the degradable polymer or other polymeric materials present in the composition. Latent acids which are representative of materials having the above properties include hydroxyl functional naphthalene compounds (e.g. beta-naphthol); phenols; and the halogen substituted naphthols and phenols (e.g. p-chlorophenol).

In addition to the two esential materials specifically described above, the composition used in the imaging method of this invention can also contain one or more thermoplastic resins. Thermoplastic resins which are suitable for use in these compositions may or may not be compatible with one or more of the essential ingredients also contained therein. The thermoplastic resins useful in this composition should preferably be substantially nonabsorbing of the activating electromagnetic radiation needed for inducing protolytic dissociation of the latent acid. Typical of such resins are the acrylates, the methacrylates, the methylmethacrylates, styrene, $\alpha$-methylstyrene, isoprene, phenyl isocyanate, and ethyl isocyanate.

Where the thermoplastic resin used in this composition is substantially incompatible with the two essential ingredients of the composition, the addition of such essential ingredients to the thermoplastic resin can result in the formation of finely dispersed microdomains of essential ingredients through this thermoplastic matrix. This type of composition is especially preferred since the isolation of the essential material within such a matrix more precisely confines acid degradation to the illuminated areas of the composition, thus, insuring better image resolution.

Upon the formulation of the composition from the appropriate ingredients in their proper relative proportions, it is preferable that such composition be formed into a film having a thickness in the range of from about 0.1 to about 300 microns. This film can then be imaged with ultraviolet light at an intensity and for an interval sufficient to cause visually discernable differences between the exposed and nonexposed regions of the film. For example, a composition comprising predominantly poly(acetaldehyde) and minor amounts (1 part by weight latent acid per 100 parts by weight degradable polymer) of beta-napthol can be formed from a tetrahydrofuran solution on a glass substrate such that its dry film thickness will be within the previously prescribed range. It is advisable that the formulation of such materials be carried out under conditions which insure shielding of the composition from sunlight or other sources of ultraviolet light both during and subsequent to its preparation. Once such a film has been prepared it can be selectively irradiated in imagewise configuration with ultraviolet light, preferably at wavelengths of less than 3000 A, thereby forming a visually discernable image. The physical nature of the image within the film will vary with the relative concentration of acid degradable polymer and latent acid; the temperature of the film during and subsequent to exposure; the intensity and wavelength of the ultraviolet light source; the film thickness; the elapsed time between initial imaging and subsequent thermal and/or chemical intensification, and the physical properties of the nondegradable polymer (e.g. gas transmission, crystalinity, molecular weight).

Figure 2:
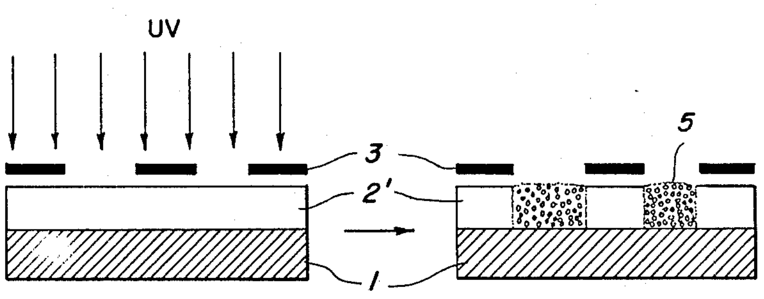
FIG. 2 is an elevational view in vertical cross-section through an imaging member wherein microbubbles are formed within the illuminated areas of its imaging layer subsequent to irradiation of said layer with ultraviolet light.
Figure 3:
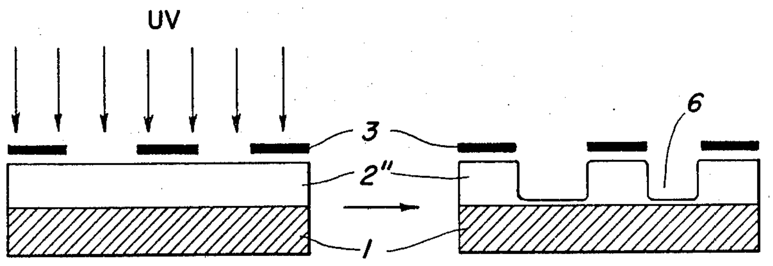
FIG. 3 is an elevational view in vertical cross-section through an imaging member wherein the exposed areas of its imaging layer are rendered almost totally devoid of polymeric material subsequent to irradiation with ultraviolet light.

In FIGS. 1 – 3 are shown different forms the image can take upon variation of one or more of the above factors. For example, where there is a predominant amount (generally in excess of about 50% by weight of acid degradable polymer in the imaged regions of the film), degradation of such imaged areas renders them substantially devoid of polymeric material (FIG. 3). On the other hand, in the event that only moderate amounts (generally from about 25 to about 40% by weight) of acid degradable polymer are present in the regions of the film subjected to activating electromagnetic radiation, the degradation of the polymer will only result in plasticizing of these exposed regions (FIG. 1). Where only very small amounts (generally less than about 10% by weight) of acid degradable polymer are present in the film its degradation upon irradiation may go undetected until the imaged areas of the film are thermally developed. Heating such films will result in an expansion of the gaseous products of polymer degradation. Prolonged delay between polymer degradation and thermal development should be avoided since the gasous degradation products can diffuse from the composition and, thus, subsequent heating of the exposed film may not produce the desired intensification of the vesicular image.

Additional embodiments of this invention can involve the development of color within the irradiated areas of such films. Typical of such an embodiment would involve the formulation of an imaging layer from the acid degradable polymer, the latent acid and an agent which is capable of color generation reaction with either the latent acid or the degradation products of the polymer. Where, for example, the reaction of this agent and the latent acid would produce a highly colored product these materials are isolated from one another in the unexposed film either by the encapsulation of either one of them in the degradable polymer or by interposition of a degradable polymer barrier (in the form of a film) between the separate layers containing only one of these color generating reactants. Upon degradation of the polymer capsule or the barrier film, the two color forming reactants are allowed to combine, thus, producing an image of high optical density.

Aside from color generation, the physical differences created within the imaging layer as a result of the selective degradation of the acid degradable polymer can serve to convert the imaging layer into a master suitable for use in planographic, intaglio or relief printing systems.

The Examples which follow further define, describe and illustrate a process for the photoinduced acid catalyzed degradation of an acid degradable polymer and the adaptation of this process for the generation of visually discernable images. Apparatus and techniques employed in such Examples, where not specified, are presumed to be standard or as hereinbefore described. Parts and percentages used in such Examples are by weight unless otherwise designated.

EXAMPLES

A series of thin films are prepared by dissolving the degradable polymer, the latent acid and other optional ingredients in the proper proportions in tetrahydrofuran (THF) and then casting the resulting solution on a suitable substrate (e.g. glass, aluminum, Mylar etc.). The dry film thickness of such layers is allowed to vary within the previously defined limits. Each of the films thus prepared is dried prior to use. Where the degradable polymer is inherently unstable at elevated temperature drying is carried out at room temperature and under a vacuum. Each of the films is selectively irradiated with ultraviolet light (UV SL - 25, 10 Watt output, Ultraviolet Products, San Gabriel, California), through a quartz glass transparency from a distance of one foot for a period of 60 seconds. The text which follows describes the preparation of such a series of films from various acid degradable polymeric compositions of this invention and the effects of irradiation on the exposed areas of such films.

EXAMPLE I

Following the procedures outlined above, imaging layer 2'', prepared from the following composition, is formed on aluminum substrate 1.

Composition of the Imaging Layer 100 parts by weight poly(acetaldehyde) - acid degradable polymer
2 parts by weight beta naphthol - latent acid Film Thickness of Imaging Layer 15 microns Subsequent to curing of imaging layer 2'', a quartz glass transparency 3, is placed above the imaging member and the imaging layer selectively irradiated in conformity with the information on said transparency. The exposed regions of the imaging layer undergo degradation in these irradiated areas, forming depressions 6 within the layer as shown in FIG. 3.

EXAMPLE II

The procedures of Example I are repeated except for the substitution of poly(butryaldehyde) for poly(acetaldehyde). The results obtained in this Example are comparable to those obtained in Example I.

EXAMPLE III

The procedures of Example I are repeated except for the substitution of alpha naphthol for beta naphthol. The results obtained in this Example are comparable to those obtained in Example I.

EXAMPLE IV

Following the procedures outlined above imaging layer 2, prepared from the following composition, is cast on an aluminum plate 1:

Composition of Imaging Layer 30 parts by weight poly(acetaldehyde) - acid degradable polymer
70 parts by weight poly(methylmethacrylate) - thermoplastic matrix
2 parts by weight beta naphthol - latent acid Film Thickness of Imaging Layer

15 microns

Subsequent to curing of imaging layer 2, a quartz glass transparency is placed above the imaging member and the imaging layer selectively irradiated in conformity with the information on said transparency. The exposed regions of imaging layer 4 become plasticized as a result of degradation of the acid degradable polymer, thus, becoming soft and tacky as shown in FIG. 1. A portion of the plasticized polymer in the exposed regions of the imaging layer can be selectively removed by simply pressure contacting this layer with a sheet of paper thereby offsetting plasticized polymer from the imaging layer to the paper. This paper can then be treated with a standard conversion fluid (Offset Electrostatic Conversion Solution No. 44-1050, available from A. B. Dick Inc., Chicago Illinois). This conversion fluid renders the background areas (the non polymer bearing areas of the paper) hydrophilic. The polymer deposits on the paper remain olephilic. This sheet of paper bearing the polymer image is now suitable for use as a lithographic master in either a direct or offset lithographic printing process.

EXAMPLE V

The procedure of Example IV are repeated except for the substitution of poly(butyraldehyde) for poly(acetaldehyde).

EXAMPLE VI

The procedures of Example IV are repeated except for the substitution of alpha naphthol for beta naphthol.

EXAMPLE VII

Following the procedures outlined above, imaging layer 2, prepared from the following composition is cast on an aluminum substrate 1:

Composition of the Imaging Layer 10 parts by weight poly(acetaldehyde) - acid degradable polymer 90 parts by weight poly(methylmethacrylate)-thermoplastic matrix 2 parts by weight beta naphthol - latent acid Film Thickness of Imaging Layer 15 microns Subsequent to curing of imaging layer 2', a quartz glass transparency is placed above the imaging member and the imaging layer selectively irradiated in conformity with the information on said transparency. The exposed regions of the imaging layer 5 become somewhat diffusive indicating the presence of small microbubbles within the bulk of the irradiated regions of the film. This image is intensified by gentle heating of the imaging layer with a hot air gun. The resulting vesicular imagee thus produced is shown in FIG. 2.

What is claimed is:

1. An imaging method based upon ultraviolet light induced acid catalyzed degradation of a composition comprising at least one acid degradable polymer of the formula:

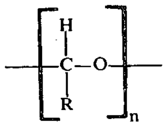

wherein

*R* is an aliphatic hydrocarbon radical of 1 – 6 carbon atoms a chlorinated aliphatic hydrocarbon radical of 1 – 6 carbon atoms, or a nitrile substituted aliphatic hydrocarbon radical of 1 – 5 carbon atoms; and *n* is at least 50 said method comprising:

a. providing an imaging member wherein the imaging layer comprises at least one acid degradable polymer of the above formula and a catalytically effective amount of at least one latent acid, said latent acid comprising a material generally regarded as non-acidic in the ground state but, which upon irradiation with ultraviolet light undergoes an electronic transition from the ground to the excited state whereupon a proton becomes dissociated from said latent acid and is released into the imaging layer containing the degradable polymer; and b. irradiating said layer in imagewise configuration with ultraviolet light for an interval sufficient to cause protolytic dissociation of the latent acid.

2. The imaging method of claim 1 wherein the ultraviolet light is at a wavelength of less than about 3000 A.

3. The imaging method of claim 1, wherein the imaging layer is of a thickness in the range of from about 0,1 to about 300 microns.

4. The imaging method of claim 1, wherein degradation of an acid degradable polymer capsule releases a material capable of reaction or combination with another substance in the imaging layer, the reaction or combination of these two materials producing an image of high optical density.

5. The imaging method of claim 1, wherein the acid degradable polymer is poly(acetaldehyde).

6. The imaging method of claim 1, wherein the acid degradable polymer is poly(butyraldehyde).

7. The imaging method of claim 1, wherein the latent acid is beta naphthol.

8. The imaging method of claim 1, wherein the imaging layer contains from about 0.1 to about 5 parts by weight latent acid per 100 parts by weight acid degradable polymer.

9. An imaging member comprising a substrate having on at least one surface thereof a degradable film having a thickness in the range of from about 0.1 to about 300 microns, said film containing a catalytically effective amount of a latent acid, said latent acid comprising a material generally regarded as non-acidic in the ground state but which upon irradiation with ultraviolet light undergoes an electronic transition from the ground to the excited state whereupon a proton becomes dissociated from said latent acid and is released into the imaging layer containing the degradable polymer, and at least one acid degradable polymer of the formula:

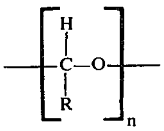

wherein

*R* is an aliphatic hydrocarbon radical of 1 – 6 carbon atoms a chlorinated aliphatic hydrocarbon radical of 1 – 6 carbon atoms, or a nitrile substituted aliphatic hydrocarbon radical of 1 – 5 carbon atoms; and

*n*, is at least 50.

10. The imaging member of claim 9, wherein the acid degradable polymer is poly(acetaldehyde).

11. The imaging member of claim 9, wherein the acid degradable polymer is poly(butyraldehyde).

12. The imaging member of claim 9, wherein the latent acid is beta naphthol.

13. The imaging member of claim 9, wherein the imaging layer contains from about 0.1 to about 5 parts by weight latent acid per 100 parts by weight acid degradable polymer.

14. A composition comprising:

a. at least one acid degradable polymer of the formula

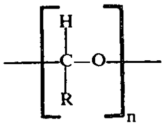

wherein

*R* is an aliphatic hydrocarbon radical of 1 – 6 carbon atom a chlorinated aliphatic hydrocarbon radical of 1 – 6 carbon atoms, or a nitrile substituted aliphatic hydrocarbon radical of 1 – 5 carbon atoms; and

*n* is at least 50 b. a catalytically effective amount of at least one latent acid, said latent acid being characterized as a material generally regarded as non-acidic in the ground state but which upon irradiation with ultraviolet light undergoes an electronic transition from the ground to the excited state whereupon a proton becomes dissociated from said latent acid and is released into the imaging layer containing the degradable polymer.

15. The composition of claim 14, wherein the acid degradable polymer is poly(acetaldehyde).

16. The composition of claim 14, wherein the acid degradable polymer is poly(butyraldehyde).

17. The composition of claim 14, wherein the latent acid is beta naphthol.

18. The composition of claim 14, wherein the imaging layer contains from about 0.1 to about 5 parts by weight latent acid per 100 parts by weight acid degradable polymer.

* * * * *